(12) United States Patent
Nakagoshi et al.

(10) Patent No.: US 9,113,571 B2
(45) Date of Patent: Aug. 18, 2015

(54) ELECTRONIC COMPONENT MODULE AND METHOD FOR MANUFACTURING THE SAME

(71) Applicant: Murata Manufacturing Co., Ltd., Nagaokakyo-shi, Kyoto-fu (JP)

(72) Inventors: Hideo Nakagoshi, Nagaokakyo (JP); Yoichi Takagi, Nagaokakyo (JP); Nobuaki Ogawa, Nagaokakyo (JP); Hidekiyo Takaoka, Nagaokakyo (JP); Kosuke Nakano, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 137 days.

(21) Appl. No.: 13/920,375

(22) Filed: Jun. 18, 2013

(65) Prior Publication Data

US 2013/0343023 A1 Dec. 26, 2013

(30) Foreign Application Priority Data

Jun. 22, 2012 (JP) ................... 2012-140819

(51) Int. Cl.
*H05K 1/18* (2006.01)
*H05K 1/14* (2006.01)
(Continued)

(52) U.S. Cl.
CPC ............... *H05K 1/181* (2013.01); *H05K 1/141* (2013.01); *H05K 3/368* (2013.01); *H01L 2924/0002* (2013.01); *H05K 3/284* (2013.01); *H05K 2201/10318* (2013.01); *H05K 2201/10477* (2013.01)

(58) Field of Classification Search
USPC .......... 361/748, 760, 767, 768, 771; 174/250, 174/260, 267, 263
See application file for complete search history.

(56) References Cited

U.S. PATENT DOCUMENTS 5,863,493 A * 1/1999 Achari et al. ................. 420/557
2007/0089811 A1 4/2007 Ikeda et al.
(Continued)

FOREIGN PATENT DOCUMENTS

JP 63-18695 A 1/1988
JP 64-13790 A 1/1989
(Continued)

OTHER PUBLICATIONS

Official Communication issued in corresponding Japanese Patent Application No. 2012-140819 mailed on May 7, 2014.
(Continued)

*Primary Examiner* — Hoa C Nguyen
*Assistant Examiner* — Amol Patel
(74) *Attorney, Agent, or Firm* — Keating & Bennett, LLP

(57) ABSTRACT

In a bond portion between an electrical conductive land and a connection terminal member, an intermetallic compound producing region in which at least a Cu—Sn-based, an M-Sn-based (M indicates Ni and/or Mn), and a Cu-M-Sn-based intermetallic compound are produced is arranged so as to be present at a connection terminal member side. In this intermetallic compound producing region, when a cross section of the bond portion is equally defined into 10 boxes in a longitudinal direction and a lateral direction to define 100 boxes in total, a ratio of the number of boxes in each of which at least two types of intermetallic compounds having different constituent elements are present to the total number of boxes other than boxes in each of which only a Sn-based metal component is present is about 70% or more.

8 Claims, 8 Drawing Sheets

(51) Int. Cl.
*H05K 3/36* (2006.01)
*H05K 3/28* (2006.01)

(56) References Cited

U.S. PATENT DOCUMENTS

| | | | |
|---|---|---|---|
| 2007/0182006 A1 | 8/2007 | Amagai | |
| 2008/0257596 A1* | 10/2008 | Kaneko | 174/264 |
| 2009/0297879 A1* | 12/2009 | Zeng et al. | 428/647 |
| 2010/0084765 A1 | 4/2010 | Lee et al. | |
| 2012/0156512 A1 | 6/2012 | Nakano et al. | |
| 2012/0234589 A1* | 9/2012 | Furuichi et al. | 174/261 |

FOREIGN PATENT DOCUMENTS

| | | |
|---|---|---|
| JP | 9-45850 A | 2/1997 |
| JP | 10-193172 A | 7/1998 |
| JP | 2002-083954 A | 3/2002 |
| JP | 2002-343917 A | 11/2002 |
| JP | 2007-123395 A | 5/2007 |
| JP | 2008-16729 A | 1/2008 |
| JP | 2009526382 A | 7/2009 |
| JP | 2010-087456 A | 4/2010 |
| KR | 10-2012-0048662 A | 5/2012 |
| TW | 201124224 A1 | 7/2011 |
| WO | 2011/027659 A1 | 3/2011 |

OTHER PUBLICATIONS

Official Communication issued in corresponding Korean Patent Application No. 10-2013-0064582, mailed on Aug. 25, 2014.

* cited by examiner

ELECTRONIC COMPONENT MODULE AND METHOD FOR MANUFACTURING THE SAME

BACKGROUND OF THE INVENTION

1. Field of the Invention

The present invention relates to an electronic component module and a method for manufacturing the same. In particular, in an electronic component module that includes a circuit board; at least one electronic component and at least one substantially columnar connection terminal member, each of which is mounted on the circuit board; and a resin layer sealing the electronic component and the terminal member, the present invention relates to a structure of a bond portion provided between the connection terminal member and the circuit board and a method for manufacturing the bond portion.

2. Description of the Related Art

A technique of interest to the present invention has been disclosed, for example, in Japanese Unexamined Patent Application Publication No. 2008-16729. Japanese Unexamined Patent Application Publication No. 2008-16729 discloses a semiconductor device in which internal connection electrodes each used as a substantially columnar connection terminal member are bonded to metal pad portions for connection electrodes arranged at predetermined positions on a circuit pattern of an organic substrate, and in which the internal connection electrodes are sealed with a sealing resin. In addition, Japanese Unexamined Patent Application Publication No. 2008-16729 also discloses that the internal connection electrodes may be solder-connected to the metal pad portions for connection electrodes.

However, when the internal connection electrode is solder-connected, in a reflow process in which the semiconductor device is mounted on a mounting substrate, since solder functioning as a bonding material re-melts, and the volume thereof expands, there may arise a problem in that the solder flows or spouts out from the semiconductor device through a gap between the internal connection electrode and the sealing resin.

SUMMARY OF THE INVENTION

Accordingly, in an electronic component module, such as the above semiconductor device, preferred embodiments of the present invention prevent a bonding material from flowing out in a reflow process performed when the electronic component module is mounted on a mounting substrate.

That is, in short, preferred embodiments of the present invention prevent a bonding material from flowing out in a reflow process by producing an intermetallic compound in a bond portion between an electrical conductive land on a circuit board and a substantially columnar connection terminal member.

A preferred embodiment of the present invention is directed to the structure of an electronic component module. An electronic component module according to a preferred embodiment of the present invention includes a circuit board including a first and a second primary surface facing each other; an electronic component at least mounted on the first primary surface of the circuit board; an electrical conductive land at least provided on the first primary surface of the circuit board; a substantially columnar connection terminal member which includes a first and a second end surface facing each other, which is arranged so that the first end surface faces the electrical conductive land, and which is bonded to the electrical conductive land with a bond portion provided therebetween; and a resin layer provided on the first primary surface of the circuit board to seal the electronic component and the connection terminal member while the second end surface thereof is exposed.

As a first feature of the electronic component module according to a preferred embodiment of the present, when a cross section of the bond portion is analyzed by a wavelength-dispersive X-ray (WDX) spectrometer, an intermetallic compound producing region (hereinafter referred to as "producing region" in some cases) is present in which at least a Cu—Sn—based, an M-Sn-based, and a Cu-M-Sn-based intermetallic metal compound (M indicates Ni and/or Mn) are produced at the cross section of the bond portion. The intermetallic compounds are to be naturally produced when a Sn-based metal and a Cu-M-based alloy are used in combination as in the case in which, for example, a compound containing a Sn-based metal as a primary component is used as a bonding material to form the bond portion and a surface of the connection terminal member is at least made of a Cu-M-based alloy.

In addition, as a second feature of the electronic component module according to a preferred embodiment of the present invention, in the producing region, when the cross section of the bond portion is equally defined into 10 boxes in a longitudinal direction and a lateral direction to define 100 boxes in total, the ratio of the number of boxes in each of which at least two types of intermetallic compounds having different constituent elements are present to the total number of boxes other than boxes in each of which only a Sn-based metal component is present is approximately 70% or more (hereinafter, this ratio may also be referred to as "dispersivity" in some cases).

In other words, the phrase "boxes other than boxes in each of which only a Sn-based metal component is present" indicates boxes in each of which at least one intermetallic compound is present.

In addition, the "intermetallic compounds having different constituent elements" indicate intermetallic compounds, such as a Cu—Mn—Sn intermetallic compound and a Cu—Sn intermetallic compound. For example, since $Cu_6Sn_5$ and $Cu_3Sn$ are intermetallic compounds having the identical constituent elements (that is, Cu and Sn) to each other, those intermetallic compounds are regarded as one type of intermetallic compound. In addition, the phrase "at least two types" indicates not only the three types of intermetallic compounds: the Cu—Sn-based, the M-Sn-based, and Cu-M-Sn-based compounds, but also at least two types of intermetallic compounds including other intermetallic compounds (such as a Ag—Sn-based intermetallic compound).

The producing region preferably contains no Sn-based metal component, and even if the Sn-based metal component is contained, the content thereof is preferably approximately 30 percent by volume or less, for example. Since the Sn-based metal component may re-melt and flow out, for example, when placed in a high temperature atmosphere of approximately 300° C. or more, for example, the heat resistance of the bond portion may be degraded. Hence, when the content of the Sn-based metal component is set to approximately 30 percent by volume or less, the degradation in heat resistance can be significantly reduced or prevented.

In the bond portion, when the producing region is located at a connection terminal member side, and a region containing the Sn-based metal component in an amount larger than that in the producing region is located at an electrical conductive land side so that the bond portion is not entirely defined by the producing region, since a reaction producing an intermetallic compound starts from the connection terminal member side, voids produced by this reaction are likely to escape to the electrical conductive land side and are unlikely to stay in the producing region. On the other hand, even if voids remain at the electrical conductive land side containing a large amount of the Sn-based metal component, since the intermetallic compound is not substantially produced in this area, the voids are not gathered together but are present in a dispersed state, and hence no voids function as starting points to generate cracks. Accordingly, the generation of cracks can be significantly reduced or prevented.

For example, the connection terminal member is preferably entirely made of a Cu-M-based alloy, or a surface of the connection terminal member is preferably made of a plating film of a Cu-M-based alloy.

The producing region is also preferably present at the second end surface of the connection terminal member, that is, at the end surface opposite to the bond portion. For example, when the connection terminal member contains Cu as a primary component, in a reflow process in which mounting is performed on a mounting substrate, solder leaching of Cu occurs, and the bond reliability is disadvantageously degraded. However, as described above, when the producing region is present at the end surface opposite to the bond portion of the connection terminal member, the intermetallic compound is not melted even at a reflow temperature, diffusion between the solder and the connection terminal member can be prevented in a reflow process, and as a result, the bond reliability can be maintained at a high level.

A method for manufacturing an electronic component module according to another preferred embodiment of the present invention includes the steps of preparing a circuit board which includes a first and a second primary surface facing each other and which is at least provided on the first primary surface with an electrical conductive land; preparing an electronic component; preparing a substantially columnar connection terminal member which includes a first and a second end surface facing each other and which includes a surface at least formed from a Cu-M-based alloy (M indicates Ni and/or Mn); preparing a bonding material containing as a primary component a low melting point metal having a melting point lower than that of the Cu-M-based alloy; mounting the electronic component at least on the first primary surface of the circuit board; arranging the connection terminal member so that the first end surface thereof faces the electrical conductive land with a bonding material provided therebetween; performing a heat treatment at a temperature at which the low melting point metal is melted so that the connection terminal member and the electrical conductive land are bonded to each other with the bonding material provided therebetween; and forming a resin layer on the first primary surface of the circuit board so as to seal the electronic component and the connection terminal member.

In addition, in a method for manufacturing an electronic component module according to a preferred embodiment of the present invention, the above-described low melting point metal is preferably formed from a Sn element or an alloy containing approximately at least 70 percent by weight of Sn, the above-described Cu-M-based alloy is an alloy which produces an intermetallic compound with this low melting point metal and which has a lattice constant difference of approximately 50% or more with respect to the intermetallic compound, and the above-described heat treatment step includes a step of producing at least a Cu—Sn-based, an M-Sn-based, and a Cu-M-Sn-based intermetallic compound between the connection terminal member and the electrical conductive land.

In a method for manufacturing an electronic component module according to a preferred embodiment of the present invention, the above-described low melting point metal is preferably formed from a Sn element or an alloy containing approximately at least 85 percent by weight of Sn, for example. The reason for this is that the low melting point metal and the Cu-M-based alloy are more likely to form an intermetallic compound.

In addition, the low melting point metal is preferably formed from a Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P. When the low melting point metal has such a composition, an intermetallic compound can be easily formed with the Cu-M-based alloy.

In order to easily form an intermetallic compound with the Sn-based low melting point metal at a lower temperature and for a shorter time, in the Cu-M-based alloy, the content of M is preferably approximately 5 to 30 percent by weight and more preferably approximately 10 to 15 percent by weight, for example.

The connection terminal member including a surface at least formed from a Cu-M-based alloy may be obtained, for example, from a Cu-M-based alloy or by forming the surface using a plating film of a Cu-M-based alloy. In the former case, when the temperature in the heat treatment step is increased, and the time therefor is increased, a reaction with the connection terminal member progresses until the Sn component contained in the bonding material is completely consumed, and as a result, the bond portion can be entirely formed of the intermetallic compound producing region. In the latter case, since a reaction to produce an intermetallic compound only occurs to form a film having a thickness corresponding to that of the plating film, when the thickness of the plating film is adjusted, the thickness of the intermetallic compound producing region can be adjusted. Of course, even in the former case, when the temperature and/or the time of the heat treatment step is controlled, the thickness of the intermetallic compound producing region can also be adjusted.

For example, when the structure of the latter case described above is used, in the heat treatment step, the amount of an intermetallic compound produced at the electrical conductive land side can be easily controlled smaller than that of an intermetallic compound produced at the connection terminal member side.

According to various preferred embodiments of the present invention, the intermetallic compound produced in the producing region enables the bond portion to have a higher melting point. Accordingly, in a back end process or a reflow process performed at a user side, re-melting can be made difficult to occur in the bond portion. Hence, the problem in that the bonding material flows or spouts out through the gap between the connection terminal member and the resin layer due to the volume expansion of the bonding material caused by re-melting can be prevented.

In addition, even if the bonding material containing a Sn-based low melting point metal, which forms the bond portion, re-melts and tends to flow out through the gap between the connection terminal member and the resin layer, when the bonding material and the connection terminal member come into contact with each other, a reaction producing a Cu—Sn-based, an M-Sn-based, and a Cu-M-Sn-based intermetallic compound can be performed in a relatively short time, and the low melting point metal is consumed by this reaction. Hence, by the reaction described above, the problem in that the bonding material flows or spouts out can also be made difficult to occur.

In addition, the problem of peeling among the resin layer, the connection terminal member, and the bond portion, which may be caused by the volume expansion of the bonding material, can also be prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
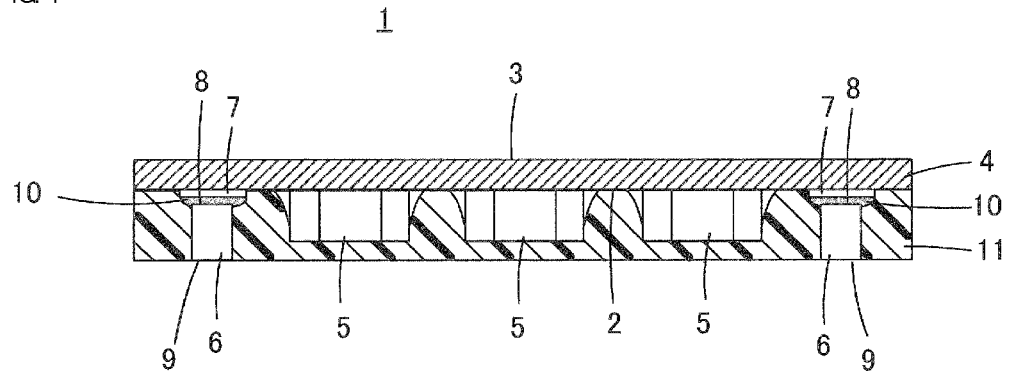
FIG. 1 is a cross-sectional view showing an electronic component module according to a preferred embodiment of the present invention.

With reference to FIG. 1, an electronic component module 1 according to a preferred embodiment of the present invention will be described.

The electronic component module 1 includes a circuit board 4 including a first primary surface 2 and a second primary surface 3 facing each other. The circuit board 4 preferably includes, for example, a multilayered ceramic substrate manufactured by laminating a plurality of ceramic green sheets, followed by performing firing. The ceramic green sheet is a sheet obtained from a slurry formed by mixing a mixed powder containing alumina, glass, and the like, which is used as a raw material for a low temperature sinterable ceramic, with an organic binder, a solvent, and the like. The ceramic green sheet is processed by a laser treatment or the like to form via holes, and a conductive paste containing Ag, Cu, and/or the like is filled in the via holes thus formed, so that via conductors for interlayer connection are formed. In addition, a conductive paste is applied to the ceramic green sheets to form various electrode patterns.

Subsequently, the ceramic green sheets are laminated and press-bonded to each other to form a ceramic laminate, and firing is then performed at a relatively low temperature of approximately 1,000° C. so as to form the circuit board 4. In the circuit board 4 thus obtained, although not shown in FIG. 1, wire conductors including via conductors and internal electrode patterns are provided.

In addition, besides the case described above in which the circuit board 4 is obtained from a multilayered ceramic substrate including ceramic layers formed of a low temperature sinterable ceramic material, the circuit board 4 may also be formed of an alumina substrate, a glass substrate, a composite material substrate, a printed circuit substrate using a resin or a polymer material, or a single-layer substrate, and in accordance with the purpose of use of the electronic component module 1, a most preferable material or structure may be appropriately selected.

On the first primary surface 2 of the circuit board 4, a plurality of electronic components 5, such as a chip component and an integrated circuit (IC), is mounted. In addition, as in the case described above, on the first primary surface 2, a plurality of substantially columnar connection terminal members 6 is mounted. In FIG. 1, electrical conductive lands 7 used to mount the connection terminal members 6 are shown. The electrical conductive lands 7 are located on the first primary surface 2 of the circuit board 4. The substantially columnar connection terminal member 6 includes a first end surface 8 and a second end surface 9 facing each other, is arranged so that the first end surface 8 faces the electrical conductive land 7, and is bonded thereto with a bond portion 10 provided between the electrical conductive land 7 and the columnar connection terminal member 6. In addition, the composition and structure of the bond portion 10 will be described later in detail with reference to FIGS. 3A and 3B.

In the electronic component module 1, while the second end surfaces 9 of the connection terminal members 6 are exposed, a resin layer 11 is provided on the first primary surface 2 of the circuit board 4 so as to seal the electronic components 5 and the connection terminal members 6. In FIG. 1, although the top surfaces of the electronic components 5 are covered with the resin layer 11, the electronic components 5 may be sealed while the top surfaces thereof are exposed.

Figure 2A:
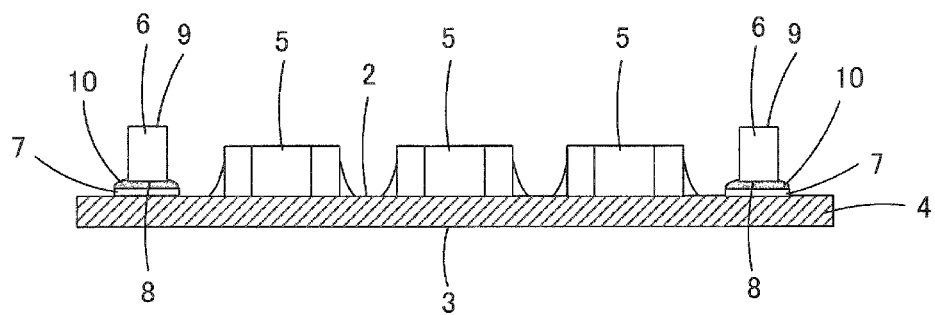
FIGS. 2A to 2C are cross-sectional views sequentially showing steps of manufacturing the electronic component module shown in FIG. 1.

Next, with reference to FIGS. 2A to 2C, a method for manufacturing the electronic component module 1 will be described. In addition, in FIGS. 2A to 2C, the electronic component module 1 shown in FIG. 1 is shown upside down.

First, the circuit board 4 is formed by the method as described above, and as shown in FIG. 2A, the electronic components 5 and the connection terminal members 6 are then mounted on the first primary surface 2 of the circuit board 4 with a bonding material. In particular, the mounting of the connection terminal member 6 will be described in more detail with reference to FIGS. 3A and 3B.

Figure 3A:
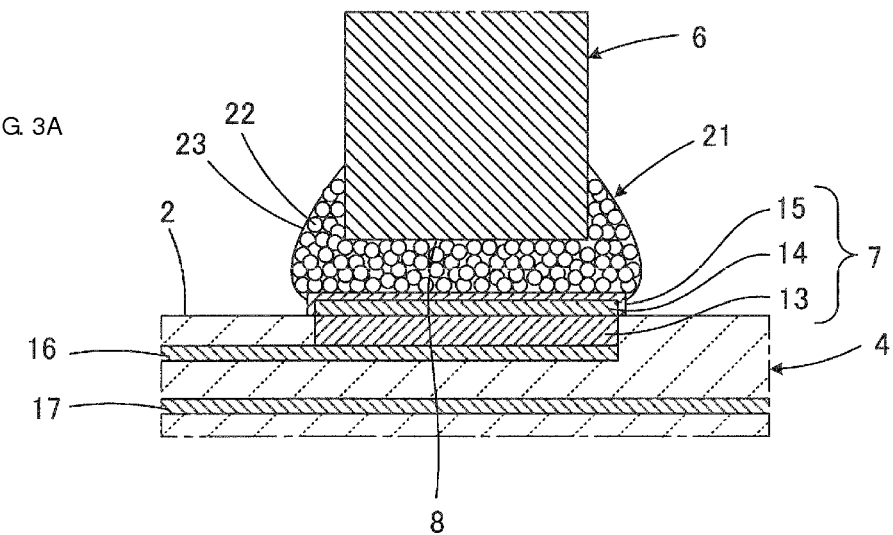
FIG. 3A is an enlarged cross-sectional view illustrating the step shown in FIG. 2A in detail in which a connection terminal member and an electrical conductive land are arranged with a bonding material provided therebetween.
Figure 3B:
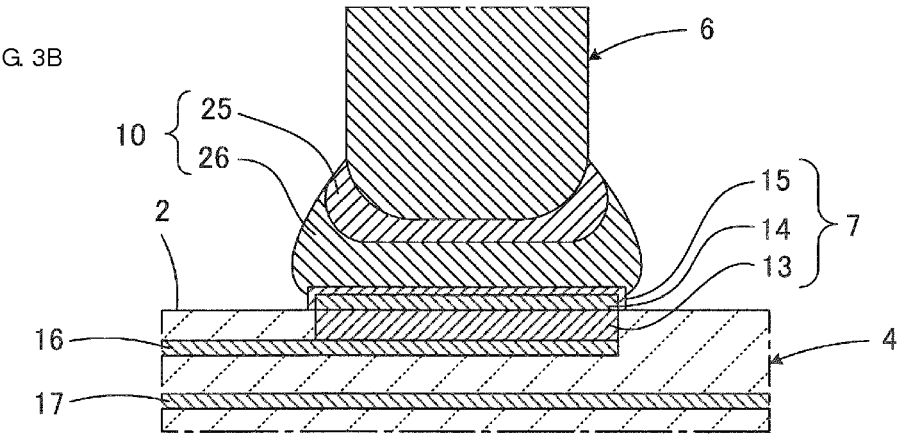
FIG. 3B is an enlarged cross-sectional view illustrating the step shown in FIG. 2A in detail in which a heat treatment is performed to bond the connection terminal member and the electrical conductive land with a bond portion provided therebetween.

FIGS. 3A and 3B are each a partially enlarged view of the circuit board 4 and the connection terminal member 6. In FIGS. 3A and 3B, although the electrical conductive land 7 provided for the circuit board 4 is shown, in this preferred embodiment, the electrical conductive land 7 preferably includes an underlayer 13, a first plating layer 14 located thereon, and a second plating layer 15 located on the first plating layer 14. As a typical structure, the underlayer 13 is formed preferably by firing an electrical conductive paste containing Cu, the first plating layer 14 is formed of a Ni plating film, and the second plating layer 15 is formed of a Au plating film. In addition, in FIGS. 3A and 3B, internal electrode patterns 16 and 17 located inside the circuit board 4 are also shown. The internal electrode pattern 16, which is one of the internal electrode patterns, is electrically connected to the electrical conductive land 7.

Figure 4:
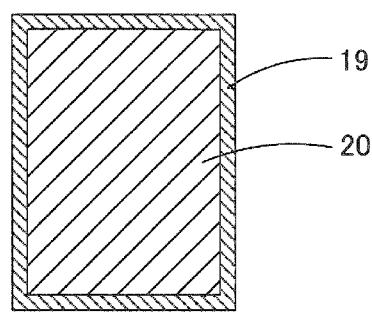
FIG. 4 is a cross-sectional view showing a modified example of the connection terminal member shown in FIG. 3A.

As the connection terminal member 6, a member having a surface at least formed from a Cu-M-based alloy (M indicates Ni and/or Mn) is prepared. The connection terminal member 6 may be entirely formed from the Cu-M-based alloy as shown in FIG. 3A, or a main body portion 20 of the connection terminal member 6 may be covered with a plating film 19 formed of the Cu-M-based alloy as shown in FIG. 4. In the latter case, the main body portion 20 of the connection terminal member 6 is formed, for example, from Cu. The connection terminal member 6 has desired cross-sectional and longitudinal dimensions and can be obtained, for example, by cutting a metal wire material having substantially a circular or polygonal cross-sectional shape into a predetermined length.

On the other hand, a bonding material 21 shown in FIG. 3A is prepared. The bonding material 21 is used to form the bond portion 10 described above and is formed by dispersing a metal powder 22 having a melting point lower than that of the Cu-M-based alloy in a flux 23.

As the low melting point metal, a Sn element or an alloy containing approximately at least 70 percent by weight of Sn or preferably approximately at least 85 percent by weight of Sn is preferably used, for example. In more particular, the low melting point metal is a Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si Sr, Te, and P. When the low melting point metal is selected to have the composition as described above, an intermetallic compound can be easily produced with the Cu-M-based alloy that at least forms the surface of the connection terminal member 6.

The flux 23 described above functions to remove oxide films on the surfaces of the connection terminal member 6 and the electrical conductive land 7, each of which is a bonding object to be bonded, and on the surface of the metal powder 22 contained in the bonding material 21. However, the bonding material 21 is not always necessary to contain the flux 23, and a bonding method without using the flux 23 may also be used. For example, by a method in which heating is performed under pressure application condition or a method in which heating is performed in a strong reducing atmosphere, the oxide films on the surfaces of the bonding objects and the metal powder can be removed, and as a result, highly reliable bonding can be realized. In addition, when the flux 23 is contained, the content thereof with respect to the total bonding material 21 is preferably approximately 7 to 15 percent by weight, for example.

As the flux 23, known products containing a vehicle, a solvent, a thixotropic agent, an activator, and/or the like may be used.

As particular examples of the vehicles, for example, there may be considered for possible use rosin-based resins and synthetic resins, which are formed from a rosin and a derivative thereof such as a modified rosin, or mixtures thereof. As particular examples of the rosin-based resins formed from a rosin and a derivative thereof such as a modified rosin, for example, a gum rosin, a tall rosin, a wood rosin, a polymerized rosin, a hydrogenated rosin, a formylated rosin, a rosin ester, a rosin-modified maleic resin, a rosin-modified phenol resin, a rosin-modified alkyd resin, and other various rosin derivatives may be considered for possible use. As particular examples of the synthetic resins formed from a rosin and a derivative thereof such as a modified rosin, for example, a polyester resin, a polyamide resin, a phenoxy resin, and a terpene resin may be considered for possible use.

In addition, as the solvents, an alcohol, a ketone, an ester, an ether, an aromatic compound, and a hydrocarbon have been known, and as particular examples, for example, there may be considered for possible use benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethyl hexanediol, toluene, xylene, propylene glycol monophenyl ether, diethylene glycol monohexyl ether, ethylene glycol monobutyl ether, diethylene glycol monobutyl ether, di-isobutyl adipate, hexylene glycol, cyclohexane dimethanol, 2-terpinyl oxyethanol, 2-dihydroterpinyl oxyethanol, and a mixture thereof.

In addition, as particular examples of the thixotropic agents, for example, there may be considered a hydrogenated castor oil, a carnauba wax, an amide, a hydroxy fatty acid, dibenzylidene sorbitol, a bis(p-methylbenzylidene)sorbitol, a bees wax, an amide stearate, and ethylenebisamide hydroxystearate. In addition, for example, when a fatty acid, such as caprylic acid, lauric acid, myristic acid, palmitic acid, stearic acid, or behenic acid; a hydroxy fatty acid such as 1,2-hydroxy stearic acid; an antioxidant; a surfactant; and/or an amine is added, if necessary, to the compounds considered for possible use above, mixtures thus obtained may also be used as the thixotropic agent.

In addition, as the activator, for example, a hydrohalogenic acid salt of an amine, an organic halogenated compound, an organic acid, an organic amine, and a polyhydric alcohol may be considered for possible use.

As particular examples of the hydrohalogenic acid salt of an amine used as the activator, for example, there may be considered for possible use diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

As particular examples of the organic halogenated compound as the activator, for example, there may be considered for possible use a chloroparaffin, tetrabromoethane, dibromopropanol, 2,3-dibromo-1,4-butanediol, 2,3-dibromo-2-butene-1,4-diol, and tris(2,3-dibromopropyl)isocyanurate.

In addition, as particular examples of the organic acid as the activator, for example, there may be considered for possible use malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid, and as particular examples of the organic amine, for example, there may be considered for possible use monoethanolamine, diethanolamine, triethanolamine, tributylamine, aniline, and diethylaniline.

In addition, as the polyhydric alcohol as the activator, for example, erythritol, pyrogallol, and ribitol may be considered for possible use.

In addition, as the flux 23, there may be used a compound containing at least one thermosetting resin selected from the group consisting of an epoxy resin, a phenol resin, a polyimide resin, a silicone resin or a modified resin thereof, and an acrylic resin or at least one thermoplastic resin selected from the group consisting of a polyamide resin, a polystyrene resin, a polymethacrylic resin, a polycarbonate resin, and a cellulose resin.

On the other hand, the Cu-M-based alloy at least forming the surface of the connection terminal member 6 is an alloy that can produce an intermetallic compound having a melting point of approximately 310° C. or more in combination with the above Sn-based low melting point metal by heat melting of the bonding material 21. When the Cu-M-based alloy is a Cu—Mn-based alloy, the content of Mn in the alloy is preferably approximately 10 to 15 percent by weight, and when the Cu-M-based alloy is a Cu—Ni-based alloy, the content of Ni in the alloy is preferably approximately 10 to 15 percent by weight, for example.

When the Cu-M-based alloy is selected to have the composition as described above, an intermetallic compound can be easily formed with the Sn-based low melting point metal at a lower temperature and for a shorter time. This intermetallic compound is not melted in a reflow process which is subsequently performed.

In the Cu-M-based alloy, for example, approximately 1 percent by weight or less of impurities may be contained as far as the reaction with the Sn-based low melting point metal is not disturbed. As the impurities, for example, Zn, Ge, Ti, Sn, Al, Be, Sb, In, Ga, Si, Ag, Mg, La, P, Pr, Th, Zr, B, Pd, Pt, Ni, and Au may be considered for possible use.

In addition, in consideration of bonding properties and reactivity, the oxygen content in the low melting point metal powder 22 is preferably approximately 2,000 ppm or less and particularly preferably approximately 10 to 1,000 ppm, for example.

In addition, the Cu-M-based alloy is selected so that a lattice constant difference between the Cu-M-based alloy and an intermetallic compound produced around the low melting point metal powder 22, that is, produced in the bond portion 10 (see FIGS. 2A and 3B), is approximately 50% or more, for example. As shown in the following formula, the lattice constant difference described above indicates an absolute value (%) calculated by multiplying 100 times a value that is obtained by dividing the difference between the lattice constant of the Cu-M-based alloy and that of the intermetallic compound by the lattice constant of the Cu-M-based alloy. That is, this lattice constant difference indicates the difference of the lattice constant of an intermetallic compound first produced at the interface with the Cu-M-based alloy from that of the Cu-M-based alloy, and whether the lattice constant of the first produced intermetallic compound is larger or smaller than that of the Cu-M-based alloy compound is not a subject to be discussed.

The lattice constant difference is represented by the following formula.

$$\text{Lattice Constant Difference (\%)}=[|\{(\text{lattice constant of intermetallic compound})-(\text{lattice constant of Cu-M-based alloy})\}|/(\text{lattice constant of Cu-M-based alloy})] \times 100$$

With reference to FIG. 3A again, the bonding material 21 is provided between the connection terminal member 6 and the electrical conductive land 7, and the connection terminal member 6 is arranged so that the first end surface 8 thereof faces the electrical conductive land 7. In addition, in the state as described above, a heat treatment is performed at a temperature at which the low melting point metal powder 22 contained in the bonding material 21 is melted. The state after the heat treatment is shown in FIG. 3B.

By the heat treatment described above, when the bonding material 21 is heated, and the temperature thereof reaches a temperature equal to or more than the melting point of the Sn-based low melting point metal forming the low melting point metal powder 22, the low melting point metal powder 22 is melted, and the form of powder disappears.

Subsequently, when the heating is further performed, the Sn-based low melting point metal reacts with the Cu-M-based alloy present at the surface of the connection terminal member 6, and the bond portion 10 as shown in FIG. 3B is formed.

When a cross section of the bond portion 10 is analyzed by a wavelength-dispersive X-ray (WDX) spectrometer, the presence of an intermetallic compound producing region 25 in which at least a Cu—Sn-based, an M-Sn-based, and a Cu-M-Sn-based intermetallic compound are produced is confirmed at the cross section of this bond portion 10. In this intermetallic compound producing region 25, it is also confirmed by WDX that when the cross section of the bond portion 10 is equally defined into 10 boxes in a longitudinal direction and a lateral direction to define 100 boxes in total, the ratio (dispersivity) of the number of boxes in each of which at least two types of intermetallic compounds having different constituent elements are present to the total number of boxes other than boxes in each of which only the Sn-based metal component is present is approximately 70% or more, for example.

As described above, when at least three types of intermetallic compounds, that is, at least a Cu—Sn-based, an M-Sn-based, and a Cu-M-Sn-based intermetallic compound, are present in the intermetallic compound producing region 25, and the intermetallic compounds in the producing region 25 are in a well dispersed state having a dispersivity of approximately 70% or more, stress concentration is not likely to occur, and as apparent from the following experimental examples, even if a stress is applied to the bond portion 10 by strain caused by the difference in coefficient of linear expansion generated by heat shock and/or the like, cracks are not likely to occur. Hence, as a result, problems, such as an increase in resistance and a decrease in bonding strength of the bond portion 10, can be made difficult to occur.

As shown in FIG. 3B, the intermetallic compound producing region 25 is preferably located at a connection terminal member 6 side, and at an electrical conductive land 7 side, a Sn rich region 26 containing the Sn-based metal component in an amount larger than that of the producing region 25 is preferably located. The reason for this is as follows.

In the process in which the producing region 25 is produced, although voids are generally generated, if the Cu-M-based alloy is also placed at the electrical conductive land 7 side, the production of the intermetallic compound simultaneously occurs from the top and the bottom sides of the bond portion 10, and hence the generated voids are liable to gather at the center thereof. In addition, in such a bonding step, a pressure is applied to the bond portion 10 from the top and the bottom sides thereof. Hence, inside the bond portion 10, the generated voids are connected to each other, and as a result, a large layered space is formed so as to remain. When the large space is present inside the bond portion 10, by a drop test and/or a heat shock test, cracks may be generated from the space in some cases. In particular, when the crack becomes large, and the bond portion 10 is fractured, a serious problem may arise.

On the other hand, as shown in FIG. 3B, when the intermetallic compound producing region 25 is located only at the connection terminal member 6 side, that is, when the intermetallic compound is produced only between the connection terminal member 6 and the bond portion 10, since the reaction starts in one direction, the generated voids are likely to escape to the electrical conductive land 7 side and are not likely to stay inside the producing region 25. In addition, even if voids remain in the Sn rich region 26 at the electrical conductive land side, since the intermetallic compound is not substantially produced in this region, the voids are not gathered together and are present in a dispersed state, and hence no voids function as a starting point of cracks. Accordingly, the generation of cracks can be prevented.

The structure as described above in which the intermetallic compound producing region 25 is located at the connection terminal member 6 side and the Sn rich region 26 is located at the electrical conductive land 7 side can be more easily obtained by using the connection terminal member 6 as shown in FIG. 4, the surface of which is formed of the plating film 19 of the Cu-M-based alloy. The reason for this is that since a reaction producing an intermetallic compound only occurs to form a film having a thickness corresponding to that of the plating film 19, when the thickness of the plating film 19 is adjusted, the thickness of the intermetallic compound producing region 25 can be adjusted.

In addition, if the above advantage obtained by the structure in which the intermetallic compound producing region 25 is located at the connection terminal member 6 side, and the Sn rich region 26 is located at the electrical conductive land 7 side is not particularly desired, the electrical conductive land 7 may has a surface at least formed from the Cu-M-based alloy.

In order to improve heat resistance of the bond portion and particularly that of the producing region 25, the producing region 25 preferably contains no Sn-based metal component, and even when the Sn-based metal component is contained, the content thereof is preferably set to approximately 30 percent by volume or less, for example. Since the Sn-based metal component may re-melt and flow out if placed, for example, in a high temperature atmosphere of approximately 300° C. or more, the heat resistance of the producing region 25 is degraded. Hence, when the content of the Sn-based metal component is set to approximately 30 percent by volume or less, the heat resistance can be further improved. For the reduction in content of the Sn-based metal component as described above, the lattice constant is responsible to a certain extent.

As described above, when the lattice constant difference between the lattice constant of the Cu-M-based alloy at least forming the surface of the connection terminal member 6 and that of the intermetallic compound produced in the producing region 25 is approximately 50% or more, the intermetallic compound is rapidly produced by the reaction between the Sn-based low melting point metal forming the low melting point metal powder 22 contained in the bonding material 21 and the Cu-M-based alloy at least forming the surface of the connection terminal member 6, and within a short time, the content of the Sn-based metal component in the producing region 25 can be sufficiently reduced.

In addition, the bonding material 21 may be, for example, a plate-shaped solid instead of the paste as described above.

In addition, the bonding material 21 may further contain a powder formed from the Cu-M-based alloy besides the Sn-based low melting point metal powder 22. In this case, even if the surface of the connection terminal member 6 is not at least formed from the Cu-M-based alloy, that is, for example, even if the connection terminal member 6 is formed from Cu, the intermetallic compound producing region 25 in which at least a Cu—Sn-based, an M-Sn-based, and a Cu-M-Sn-based intermetallic compound are produced can be formed in the bond portion 10.

Figure 2B:
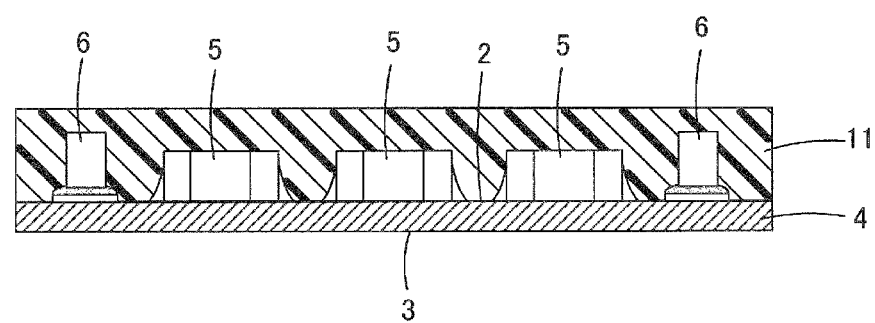

Next, as shown in FIG. 2B, the resin layer 11 is formed on the first primary surface 2 of the circuit board 4 so as to seal the electronic components 5 and the connection terminal members 6. The resin layer 11 may be formed from a composite resin prepared by mixing a thermosetting resin, such as an epoxy resin, a phenol resin, or a cyanate resin with an inorganic filler, such as aluminum oxide, silica (silicon dioxide), or titanium dioxide.

For example, when the resin layer 11 is formed using a semi-cured resin sheet prepared by molding a composite resin on a PET film, after the resin sheets are arranged to cover the circuit board 4 with a spacer or a frame, each having a desired thickness, provided around the circuit board 4 and are then heat-pressed so as to have a thickness equivalent to that of the spacer or the frame, the circuit board 4 is heated in an oven to cure the resin, so that the resin layer 11 is formed to have a desired thickness.

In addition, the resin layer 11 may also be formed using another common molding technique to form a resin layer, such as a potting technique using a liquid resin, a transfer molding technique, or a compression molding technique, for example.

Figure 2C:
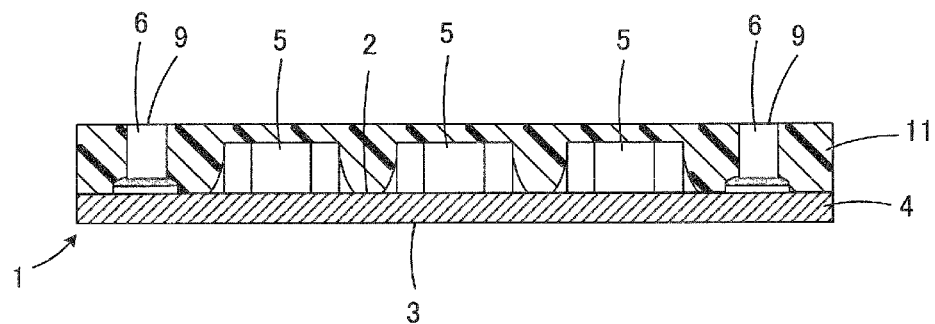

Next, as shown in FIG. 2C, when the surface of the resin layer 11 is ground or polished by a roller blade or the like, an unnecessary resin is removed to planarize the surface of the resin layer 11, and the second end surfaces 9 of the connection terminal members 6 are also exposed to the surface of the resin layer 11. Accordingly, the electronic component module 1 is formed. In addition, although not shown in the drawing, in this step, grinding and/or polishing may be performed so as to expose the top surfaces of the electronic components 5. In addition, when the electronic component 5 is an integrated circuit (IC), the top surface of the IC itself may also be ground and/or polished. As a result, the height of the electronic component module 1 can be further reduced.

If the variation in height of the connection terminal member 6 from the first primary surface 2 of the circuit board 4 occurs, for example, by the influence of the thickness of the bonding material 21 provided at the first end surface 8 side of the connection terminal member 6, when the second end surface 9 side of the connection terminal member 6 is ground or polished together with the resin layer 11, the heights of the connection terminal members 6 from the circuit board 4 can be made uniform. In addition, as described with reference to FIG. 4, when the main body portion 20 of the connection terminal member 6 is covered with the plating film 19 of the Cu-M-based alloy, even after the grinding or polishing is performed, at least a portion of the plating film 19 is made to remain.

At the stage shown in FIG. 2B, when the resin layer 11 is formed so that the second end surface 9 of the connection terminal member 6 is appropriately exposed, a step of grinding or polishing the surface of the resin layer 11 may not be always performed.

In addition, although each electronic component module 1 may be separately manufactured as described above, a method may also be used in which a mother module including a plurality of electronic component modules 1 is formed and is then separated into the individual electronic component modules 1.

Figure 5:
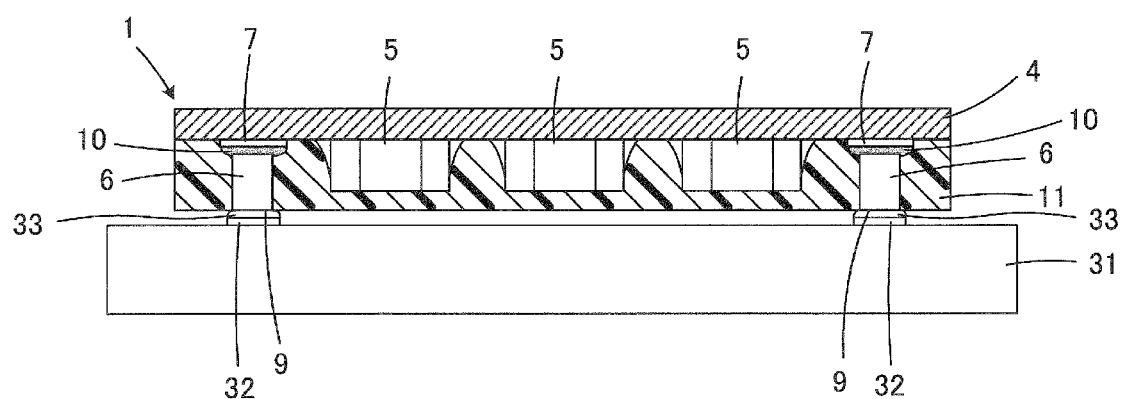
FIG. 5 is a cross-sectional view showing the state in which the electronic component module shown in FIG. 1 is mounted on a mounting substrate.

The electronic component module 1 thus obtained is mounted on a mounting substrate 31 as shown in FIG. 5. In FIG. 5, electrical conductive lands 32 provided on the mounting substrate 31 and bond portions 33 each bonding the electrical conductive land 32 and the connection terminal member 6 of the electronic component module 1 are shown. The bond portion 33 is formed, for example, from solder containing a Sn-based low melting point metal, and a reflow process is used to form the bond portion 33.

In the reflow process described above, the intermetallic compound producing region 25 (see FIG. 3B) of the bond portion 10 of the electronic component module 1 is particularly excellent in heat resistant strength, and hence re-melting does not occur.

In addition, in the reflow process, even if the Sn rich region 26 (see FIG. 3B) of the bond portion 10 re-melts and tends to flow out through the gap between the connection terminal member 6 and the resin layer 11, when the Sn-based low melting point metal contained in the Sn rich region 26 and the connection terminal member 6 come into contact with each other, the reaction producing intermetallic compounds, such as a Cu—Sn-based, an M-Sn-based, and a Cu-M-Sn-based intermetallic compound, is performed in a relatively short time, and the Sn-based low melting point metal is consumed by this reaction. Hence, by this reaction, the problem in that the bonding material 21 flows or spouts out can be made difficult to occur.

Furthermore, the following are also features of various preferred embodiments of the present invention. Since a force is applied to the connection terminal member 6 in the direction toward to the electrical conductive land 7 in the step of bonding the connection terminal member 6 and the electrical conductive land 7, as shown in FIG. 3A, the bonding material 21 is expanded to have a diameter larger than that of the connection terminal member 6. Hence, as apparent from FIG. 3B, the intermetallic compound producing region 25 has a diameter larger than that of the connection terminal member 6. As a result, the intermetallic compound producing region 25 of the bond portion 10 functions as a wall to block the gap between the connection terminal member 6 and the resin layer 11, and by this wall, the bonding material 21 can also be prevented from flowing or spouting out.

Figure 6:
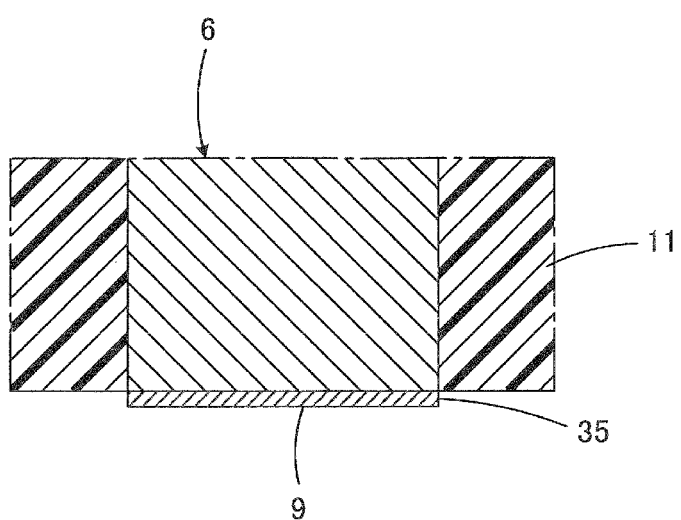
FIG. 6 is an enlarged cross-sectional view of a portion at which the connection terminal member of the electronic component module is located for illustrating a preferable structure advantageously used for the connection terminal member in mounting on the mounting substrate shown in FIG. 5.

FIG. 6 shows a preferable structure of the connection terminal member 6 of the electronic component module 1 that is advantageously used in mounting on the above mounting substrate 31. At the second end surface 9 of the connection terminal member 6 shown in FIG. 6, that is, at the end surface opposite to the bond portion 10 (not shown in FIG. 6) bonded to the electrical conductive land 7 on the circuit board 4, an intermetallic compound producing region 35 equivalent to the intermetallic compound producing region 25 is present.

When the connection terminal member 6 contains, for example, Cu as a primary component, in a reflow process for mounting on the mounting substrate 31, solder leaching of Cu occurs, and the bond reliability is disadvantageously degraded. However, as described above, when the intermetallic compound producing region 35 is also present at the second end surface 9 of the connection terminal member 6, the intermetallic compound is not melted even at a reflow temperature, and hence in the reflow process, diffusion between the solder functioning as a bonding material to form the bond portion 33 (see FIG. 5) and the connection terminal member 6 can be prevented. As a result, the bond reliability can be maintained at a high level.

In addition, when a bonding material having the same composition as that of the bonding material 21 forming the bond portion 10 is used to form the bond portion 33, although the intermetallic compound producing region 35 shown in FIG. 6 is naturally formed in a reflow process for mounting on the mounting substrate 31, the intermetallic compound producing region 35 may also be formed before the electronic component module 1 is mounted on the mounting substrate 31. In the latter case, in the step shown in FIG. 3A, when a bonding material having the same composition as that of the bonding material 21 is applied on the second end surface 9 of the connection terminal member 6, the intermetallic compound producing region 35 is formed in the step shown in FIG. 3B.

Heretofore, although the present invention has been described with reference to the preferred embodiments shown in the drawings, the present invention may also be applied to an electronic component module in which electronic components and/or connection terminal members are provided not only on the first primary surface 2 of the circuit board 4 but also on the second primary surface 3 thereof.

Next, non-limiting experimental examples carried out based on various preferred embodiments of the present invention will be described.

Experimental Example 1

Figure 7:
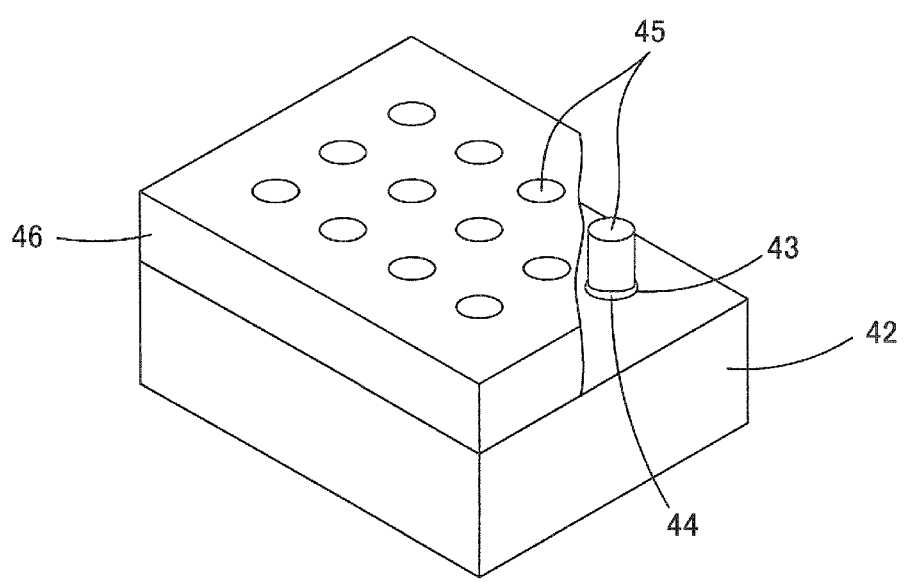
FIG. 7 is a partially exploded perspective view showing the appearance of a test work formed in an experimental example.

In Experimental Example 1, a test work 41 having the structure shown in FIG. 7 was formed.

The test work 41 was formed to have a circuit board 42 formed from a low temperature sinterable ceramic material, 12 electrical conductive lands 43 of Ni-plated Cu arranged to form a matrix of 3×4 on one primary surface of the circuit board 42, 12 columnar connection terminal members 45 bonded to the electrical conductive lands 43 with respective bond portions 44 provided therebetween, and a resin layer 46 of an epoxy resin provided on the one primary surface of the circuit board 42 so as to seal the connection terminal members 45.

The circuit board 42 had plane dimensions of 3 mm×2.4 mm and a thickness of 1 mm, the connection terminal member 45 had a diameter of 0.3 mm, a length of 0.5 mm, and an arrangement pitch of 0.6 mm, and the resin layer had a thickness of 0.55 mm.

In order to form the bond portion 44 of this test work 41, a bonding material in the form of a paste was prepared by mixing a flux and a powder of a low melting point metal shown in the column of a "low melting point metal forming bonding material" in Table 1. As the flux, a flux containing 74 percent by weight of rosin, 22 percent by weight of diethylene glycol monobutyl ether, 2 percent by weight of triethanol amine, and 2 percent by weight of hydrogenated castor oil was used. In addition, the ratio of the flux to the total of the bonding material was set to 10 percent by weight.

In addition, as the connection terminal member 45, a member formed from a "composition" described in the column of a "connection terminal member" in Table 1 was prepared. In the column of the "connection terminal member" in Table 1, a "lattice constant" based on the a axis is also shown.

Next, the circuit board 42 was prepared, and after the bonding material was applied on the electrical conductive land 43 to have a thickness of 0.05 mm, the connection terminal member 45 was arranged thereon.

Next, by using a reflow apparatus, a heat treatment was performed to bond the conductive land 43 and connection terminal member 45 in accordance with a temperature profile in which a temperature in a range of 150° C. to 180° C. was maintained for 90 seconds, a temperature of 220° C. or more was maintained for 40 seconds, a temperature of 240° C. or more was maintained for 15 seconds, and a peak temperature was set to 235° C. to 245° C., so as to form the bond portion 44.

Next, at this stage, a "first produced intermetallic compound" shown in Table 1 was evaluated. The "first produced intermetallic compound" was an intermetallic compound first produced at the interface between the bonding material and the connection terminal member 45 and was confirmed by mapping analysis of a cross section of the bond portion 44 using FE-WDX. A "lattice constant" was obtained based on the a axis. In addition, a "lattice constant difference" in Table 1 was obtained by the above-described formula.

In addition, in Table 1, representative examples of intermetallic compounds produced in the bond portion 44 are shown in the column of "examples of intermetallic compounds produced in bond portion". Hence, in the bond portion 44, intermetallic compounds other than those shown in Table 1 could also be produced. The intermetallic compounds produced in the bond portion 44 were also confirmed by mapping analysis of the cross section of the bond portion 44 using FE-WDX.

In addition, from the results obtained by the analysis described above, it was confirmed that in the bond portion 44, the intermetallic compound producing region was located at a connection terminal member 45 side, and that at an electrical conductive land 43 side, a region containing a Sn-based metal component in an amount larger than that of the intermetallic compound producing region was located.

In addition, as shown in Table 1, "dispersivity" was evaluated. The "dispersivity" was obtained by the following procedure.

By using a cross-sectional photograph of the bond portion 44, in a region in the vicinity of the interface with the connection terminal member 45, the bond portion 44 is equally defined into 10 boxes in a longitudinal direction and a lateral direction to define 100 boxes in total.

The number of boxes in each of which at least two types of intermetallic compounds are present is counted.

Among the 100 boxes thus defined, if there are boxes in each of which no intermetallic compound is present, the number of boxes other than the above boxes is regarded as the total number of boxes, and by multiplying 100 times a value obtained by dividing the number of the boxes in each of which at least two intermetallic compounds are present by the total number of boxes, the dispersivity (%) is obtained.

Next, the resin layer 46 was formed on the one primary surface of the circuit board 42 to seal the connection terminal members 45, so that the test work 41 shown in FIG. 7 was formed.

As shown in Table 1, a "flow out test", a "drop test", and a "heat shock test" were performed on the test work 41 thus formed.

The "flow out test" was performed on the test work 41 in such a way that after a pre-treatment was performed at 125° C. for 24 hours, the test work 41 was placed in a high-temperature and high-humidity atmosphere at a temperature of 85° C. and a relative humidity of 85% for 168 hours and was then heated three times under reflow conditions at a peak temperature of 260° C., and subsequently, the flow out of the bonding material was evaluated at the exposed surface of the connection terminal member 45 by external observation. When the flow out was not confirmed in every connection terminal member 45, it was evaluated as OK, and "O" was placed in the column of the "flow out test". When the flow out was confirmed in at least one of the connection terminal members 45, it was evaluated as NG, and "x" was placed in the column of the "flow out test".

Figure 8:
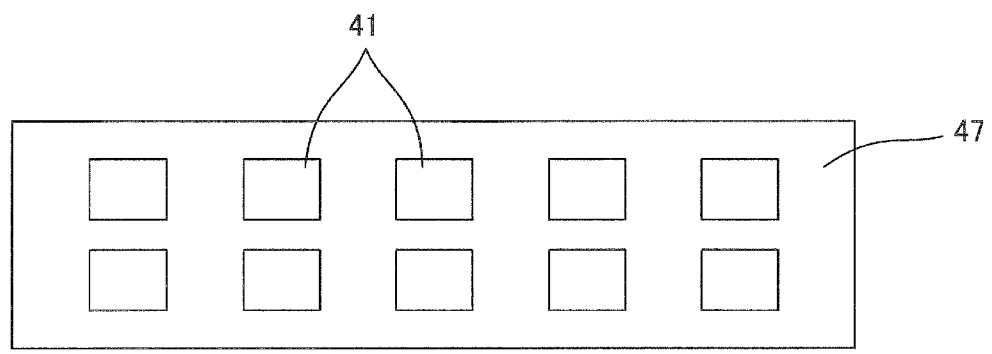
FIG. 8 is a plan view showing the state in which the test works shown in FIG. 7 are mounted on a printed circuit board.

In the "drop test", 10 test works 41 shown in FIG. 7 were mounted on a printed circuit board 47 as shown in FIG. 8, and although not shown in the drawing, this printed circuit board 47 was fitted to a holder formed from a POM (polyoxyethylene) material and having plane dimensions of 120 mm×50 mm and a thickness of 30 mm. In addition, the drop test was performed three times from a height of 1.5 m on each of six surfaces of this holder, and appearance defects were inspected. As a result, when no defects were confirmed in every test work 41, it was evaluated as OK, and "O" was placed in the column of the "drop test". When the defect was confirmed in at least one of the test works 41, it was evaluated as NG, and "x" was placed in the column of the "drop test".

In the "heat shock test", after the heat shock test, that is, after a cycle in which temperature conditions at −55° C. and +125° C. were alternately maintained for 30 minutes, was performed 1,000 times on the test work having the structure as shown in FIG. 7, an electrically conductive condition at the connection terminal member was evaluated. As a result, when the electrical conduction was obtained in each of 500 connection terminal members, it was evaluated as OK, and "O" was placed in the column of the "heat shock test". When an open defect was confirmed in at least one of the connection terminal members, it was evaluated as NG, and "x" was placed in the column of the "heat shock test".

TABLE 1

| SAMPLE NO. | LOW MELTING POINT METAL FORMING BONDING MATERIAL | CONNECTION TERMINAL MEMBER COMPOSITION | LATTICE CONSTANT a (nm) | FIRST PRODUCED INTERMETALLIC COMPOUND COMPOSITION | LATTICE CONSTANT a (nm) | LATTICE CONSTANT DIFFERENCE (%) |
|---|---|---|---|---|---|---|
| 1 | Sn—3Ag—0.5Cu | Cn—10Ni | 0.357 | $Cu_2NiSn$ | 0.597 | 67 |
| 2 | Sn—3Ag—0.5Cu | Cu—10Mn | 0.367 | $Cu_2MnSn$ | 0.617 | 68 |
| 3 | Sn | Cu—10Mn | 0.367 | $Cu_2MnSn$ | 0.617 | 68 |
| 4 | Sn—3.5Ag | Cu—10Mn | 0.367 | $Cu_2MnSn$ | 0.617 | 68 |
| 5 | Sn—0.75Cu | Cu—10Mn | 0.367 | $Cu_2MnSn$ | 0.617 | 68 |
| 6 | Sn—15Bi | Cu—10Mn | 0.367 | $Cu_2MnSn$ | 0.617 | 68 |
| 7 | Sn—0.7Cu—0.05Ni | Cu—10Mn | 0.367 | $Cu_2MnSn$ | 0.617 | 68 |
| 8 | Sn—5Sb | Cu—10Mn | 0.367 | $Cu_2MnSn$ | 0.617 | 68 |
| 9 | Sn—2Ag—0.5Cu—2Bi | Cu—10Mn | 0.367 | $Cu_2MnSn$ | 0.617 | 68 |
| 10 | Sn—30Bi | Cu—10Mn | 0.367 | $Cu_2MnSn$ | 0.617 | 68 |
| 11 | Sn—3.5Ag—0.5Bi—8In | Cu—10Mn | 0.367 | $Cu_2MnSn$ | 0.617 | 68 |
| 12 | Sn—9Zn | Cu—10Mn | 0.367 | $Cu_2MnSn$ | 0.617 | 68 |
| 13 | Sn—8Zn—3Bi | Cu—10Mn | 0.367 | $Cu_2MnSn$ | 0.617 | 68 |
| 14 | Sn—3Ag—0.5Cu | Cu—12Mn—4Ni | 0.367 | $Cu_2MnSn$ | 0.617 | 68 |
| 15 | Sn—3Ag—0.5Cu | Cu—10Mn—1P | 0.367 | $Cu_2MnSn$ | 0.617 | 68 |
| 16 | Sn—3Ag—0.5Cu | Cu | 0.361 | $Cu_3Sn$ | 0.432 | 20 |
| 17 | Sn—3Ag—0.5Cu | Cn—10Zn | 0.359 | $Cu_3Sn$ | 0.432 | 20 |
| 18 | Sn—40Bi | Cn—10Mn | 0.367 | $Cu_3Sn$ | 0.432 | 20 |

TABLE 1-continued

| SAMPLE NO. | EXAMPLES OF INTERMETALLIC COMPOUNDS PRODUCED IN BOND PORTION | DISPERSIVITY | FLOW OUT TEST | DROP TEST | HEAT SHOCK TEST |
|---|---|---|---|---|---|
| 1 | CuNiSn BASE/NiSn BASE/CuSn BASE/AgSn BASE | 85 | ○ | ○ | ○ |
| 2 | CuMnSn BASE/MnSn BASE/CuSn BASE/AgSn BASE | 100 | ○ | ○ | ○ |
| 3 | CuMnSn BASE/MnSn BASE/CuSn BASE | 100 | ○ | ○ | ○ |
| 4 | CuMnSn BASE/MnSn BASE/CuSn BASE/AgSn BASE | 100 | ○ | ○ | ○ |
| 5 | CuMnSn BASE/MnSn BASE/CuSn BASE | 100 | ○ | ○ | ○ |
| 6 | CuMnSn BASE/MnSn BASE/CuSn BASE | 100 | ○ | ○ | ○ |
| 7 | CuMnSn BASE/MnSn BASE/CuSn BASE/NiSn BASE | 100 | ○ | ○ | ○ |
| 8 | CuMnSn BASE/MnSn BASE/CuSn BASE/SnSb BASE | 100 | ○ | ○ | ○ |
| 9 | CuMnSn BASE/MnSn BASE/CuSn BASE/AgSn BASE | 100 | ○ | ○ | ○ |
| 10 | CuMnSn BASE/MnSn BASE/CuSn BASE | 78 | ○ | ○ | ○ |
| 11 | CuMnSn BASE/MnSn BASE/CuSn BASE/AgSn BASE/SnIn BASE | 100 | ○ | ○ | ○ |
| 12 | CuMnSn BASE/MnSn BASE/CuSn BASE | 100 | ○ | ○ | ○ |
| 13 | CuMnSn BASE/MnSn BASE/CuSn BASE | 100 | ○ | ○ | ○ |
| 14 | CuMnSn BASE/MnSn BASE/CuSn BASE/AgSn BASE | 100 | ○ | ○ | ○ |
| 15 | CuMnSn BASE/MnSn BASE/CuSn BASE/AgSn BASE | 100 | ○ | ○ | ○ |
| 16 | CuSn BASE/AgSn BASE | 10 | X | X | X |
| 17 | CuSn BASE/AgSn BASE | 16 | X | X | X |
| 18 | CuMnSn BASE/MnSn BASE/CuSn BASE | 55 | X | X | X |

In Table 1, Samples 16 to 18 are comparative examples out of the range of the present invention.

In Samples 1 to 15 in the range of the present invention, as apparent from the "examples of intermetallic compounds produced in bond portion", at least a Cu—Sn-based, an M-Sn-based (M indicates Ni and/or Mn), and a Cu-M-Sn-based intermetallic compound were present, and as for the "dispersivity", a value of 70% or more was obtained.

Accordingly, in Samples 1 to 15, the results obtained in the "flow out test", the "drop test", and the "heat shock test" were all evaluated as "O".

In addition, although not shown in Table 1, a sample was also evaluated in a manner similar to that described above, this sample using the same "low melting point metal forming bond material" and "connection terminal member" as those of Sample 2 and, as the electrical conductive land 43, using the same composition as that of the "connection terminal member". As a result, by this sample, the "first produced intermetallic compound", the "lattice constant difference", the "examples of intermetallic compounds produced in bond portion", and the "dispersivity" were the same as the results of Sample 2, and in the "flow out test", the "drop test", and the "heat shock test", the results were all evaluated as "O". However, in this sample, although not particularly serious, microcracks were observed at the bond portion 44.

On the other hand, in Samples 16 to 18 out of the range of the present invention, in the "flow out test", the "drop test", and the "heat shock test", the results were all evaluated as The reasons for these results are construed that the condition in which at least a Cu—Sn-based, an M-Sn-based, and a Cu-M-Sn-based intermetallic compound were present as the "examples of intermetallic compounds produced in bond portion" was not satisfied in Samples 16 and 17, and that in Samples 16 to 18, the "lattice constant difference" was small such as 20% and the "dispersivity" was less than 70%.

Experimental Example 2

Experimental Example 2 was carried out to obtain a preferable content of M in the Cu-M-based alloy at least forming the surface of the connection terminal member.

First, as a bonding material, a material containing "Sn" as shown in the column of a "low melting point metal forming bonding material" in Table 2, that is, the same material as that used in Sample 3 in Experimental Example 1, was prepared.

On the other hand, as bonding objects instead of the electrical conductive land 43 and the connection terminal member 45 in Experimental Example 1, an electrical conductive land and a connection terminal member each having the composition shown in the column of a "composition of bonding object" shown in Table 2 were prepared.

Next, under conditions similar to those in Experimental Example 1, a circuit board provided with the above electrical conductive lands and the connection terminal members were arranged with the bonding material provided therebetween, and a heat treatment was then performed using a reflow apparatus to bond the electrical conductive lands and the connection terminal members, thereby forming bond portions.

As shown in Table 2, a "remaining percentage of low melting point metal" in the bond portion thus obtained was evaluated. For the evaluation of the "remaining percentage of low melting point metal", approximately 7 mg was obtained as a sample by cutting from the bond portion thus formed and was analyzed by a differential scanning calorimetric (DSC) measurement at a measurement temperature of 30° C. to 300° C. and a temperature increase rate of 5° C./min in a nitrogen atmosphere using $Al_2O_3$ as a reference. From an endothermic amount of a melting endothermic peak at a melting temperature of Sn in an obtained DSC chart, the amount of a remaining Sn component was determined. In addition, from this Sn component amount, the ratio of the Sn component to the total metal component was obtained as the "remaining percentage of low melting point metal".

TABLE 2

| SAMPLE NO. | LOW MELTING POINT METAL FORMING BONDING MATERIAL | COMPOSITION OF BONDING OBJECT | REMAINING PERCENTAGE OF LOW MELTING POINT METAL (PERCENT BY VOLUME) |
|---|---|---|---|
| 31 | Sn | Cu—5Mn | 19 |
| 32 | Sn | Cu—10Mn | 0 |
| 33 | Sn | Cu—15Mn | 0 |
| 34 | Sn | Cu—20Mn | 9 |
| 35 | Sn | Cu—30Mn | 21 |
| 36 | Sn | Cu—5Ni | 12 |
| 37 | Sn | Cu—10Ni | 0 |
| 38 | Sn | Cu—15Ni | 0 |
| 39 | Sn | Cu—20Ni | 5 |

From Table 2, it was found that when the content of M of the Cu-M (M indicated Mn or Ni) alloy forming the bonding object was 5 to 30 percent by weight, although the amount of the remaining Sn component was reduced to a certain extent, when the content of M was 10 to 15 percent by weight, the amount of the remaining Sn component was further reduced. From the results described above, it is found that in order to easily form an intermetallic compound between the Cu-M-based alloy and the Sn-based alloy at a lower temperature and for a shorter time, in the Cu-M-based alloy, the content of M is preferably set to 5 to 30 percent by weight and more preferably set to 10 to 15 percent by weight, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an electronic component module, the method comprising the steps of:
    preparing a circuit board including a first primary surface and a second primary surface and provided on at least the first primary surface with an electrical conductive land;
    preparing an electronic component;
    preparing a columnar connection terminal member including a first end surface and a second end surface, a surface of the connection terminal member being at least formed from a Cu-M-based alloy (M is at least one of Ni and Mn);
    preparing a bonding material containing as a primary component a low melting point metal having a melting point lower than that of the Cu-M-based alloy;
    mounting the electronic component on at least the first primary surface of the circuit board;
    arranging the connection terminal member so that the first end surface thereof faces the electrical conductive land with the bonding material provided therebetween;
    performing a heat treatment at a temperature at which the low melting point metal is melted to bond the connection terminal member and the electrical conductive land with the bonding material provided therebetween; and
    forming a resin layer on the first primary surface of the circuit board to seal the electronic component and the connection terminal member; wherein
    the low melting point metal is an Sn element or an alloy containing at least approximately 70 percent by weight of Sn;
    the Cu-M-based alloy produces an intermetallic compound with the low melting point metal and has a lattice constant difference of at least approximately 50% from the intermetallic compound; and
    the heat treatment step includes a step of producing at least a Cu—Sn-based, an M-Sn-based, and a Cu-M-Sn-based intermetallic compound between the connection terminal member and the electrical conductive land.

2. The method for manufacturing an electronic component module according to claim 1, wherein the low melting point metal is a Sn element or an alloy containing at least approximately 85 percent by weight of Sn.

3. The method for manufacturing an electronic component module according to claim 1, wherein the low melting point metal is an Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P.

4. The method for manufacturing an electronic component module according to claim 1, wherein the Cu-M-based alloy contains approximately 5 percent by weight to approximately 30 percent by weight of M.

5. The method for manufacturing an electronic component module according to claim 4, wherein the Cu-M-based alloy contains approximately 10 percent by weight to approximately 15 percent by weight of M.

6. The method for manufacturing an electronic component module according to claim 1, wherein the connection terminal member includes the Cu-M-based alloy.

7. The method for manufacturing an electronic component module according to claim 1, wherein the connection terminal member includes a surface formed of a plating film of the Cu-M-based alloy.

8. The method for manufacturing an electronic component module according to claim 1, wherein in the heat treatment step, an amount of the intermetallic compound produced at an electrical conductive land side is smaller than that of the intermetallic compound produced at a connection terminal member side.

* * * * *